US010361237B2

(12) United States Patent
Ando et al.

(10) Patent No.: US 10,361,237 B2
(45) Date of Patent: Jul. 23, 2019

(54) LOW DARK CURRENT BACKSIDE ILLUMINATION SENSOR

(71) Applicant: INTERNATIONAL BUSINESS MACHINES CORPORATION, Armonk, NY (US)

(72) Inventors: Takashi Ando, Tuckahoe, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/855,307

(22) Filed: Dec. 27, 2017

(65) Prior Publication Data

US 2019/0198554 A1 Jun. 27, 2019

(51) Int. Cl.
*H01L 27/146* (2006.01)

(52) U.S. Cl.
CPC .... *H01L 27/14638* (2013.01); *H01L 27/1462* (2013.01); *H01L 27/1464* (2013.01); *H01L 27/14618* (2013.01); *H01L 27/14621* (2013.01); *H01L 27/14623* (2013.01); *H01L 27/14627* (2013.01); *H01L 27/14645* (2013.01); *H01L 27/14685* (2013.01); *H01L 27/14689* (2013.01); *H01L 27/14698* (2013.01)

(58) Field of Classification Search
CPC ......... H01L 27/14638; H01L 27/14623; H01L 27/14685; H01L 27/1464; H01L 27/14627; H01L 27/14689; H01L 27/14621; H01L 27/1462; H01L 27/14618; H01L 27/14645; H01L 27/14698

USPC ......... 257/432, 431, 435, 436, 465, 292, 80, 257/E27.13, E27.131, E27.132, E27.135, 257/E31.053, E31.055, E21.057, E31.061, 257/E21.211, E21.352, E33.067; 438/57, 438/69, 70, 73, 785, 788
See application file for complete search history.

(56) References Cited

U.S. PATENT DOCUMENTS

| | | | |
|---|---|---|---|
| 7,834,412 B2 * | 11/2010 | Ando | H01L 27/14643 257/432 |
| 8,183,603 B2 | 5/2012 | Yamaguchi et al. | |
| 8,283,195 B2 * | 10/2012 | Meynants | H01L 27/14601 257/460 |
| 8,293,563 B2 * | 10/2012 | Hiyama | H01L 27/14685 257/E31.122 |
| 8,513,587 B2 * | 8/2013 | Wang | H01L 27/1461 250/208.1 |
| 8,736,006 B1 | 5/2014 | Tsai et al. | |
| 8,975,668 B2 | 3/2015 | Costello et al. | |
| 2009/0096049 A1 * | 4/2009 | Oshiyama | H01L 27/1461 257/432 |

(Continued)

FOREIGN PATENT DOCUMENTS

| CN | 104078478 | 10/2014 |
|---|---|---|
| CN | 104752448 | 7/2015 |

(Continued)

*Primary Examiner* — Dao H Nguyen
(74) *Attorney, Agent, or Firm* — Tutunjian & Bitetto, P.C.; Vazken Alexanian

(57) ABSTRACT

Light sensors and methods of making the same include a photodiode and a hole accumulation layer directly on a sensing surface of the photodiode. A metal oxide layer is formed over the hole accumulation layer. An anti-reflection layer is formed over the metal oxide layer.

18 Claims, 3 Drawing Sheets

(56) References Cited

U.S. PATENT DOCUMENTS

| | | | |
|---|---|---|---|
| 2009/0230488 A1* | 9/2009 | Ando | ............... H01L 27/1462 257/432 |
| 2016/0225812 A1 | 8/2016 | Elkhatib et al. | |
| 2016/0329367 A1 | 11/2016 | Komori et al. | |

FOREIGN PATENT DOCUMENTS

| CN | 105655361 | 6/2016 |
|---|---|---|
| CN | 103077883 | 8/2016 |

* cited by examiner

LOW DARK CURRENT BACKSIDE ILLUMINATION SENSOR

BACKGROUND

Technical Field

The present invention generally relates to light sensors and, more particularly, to low-dark current backside illumination light sensors.

Description of the Related Art

Light sensors can be formed using complementary metal-oxide semiconductor (CMOS) processes and structures by, for example, creating a photodiode from the interface of a p-type semiconductor region and an n-type semiconductor region or, alternatively, from a p-i-n junction. When light arrives at such a photodiode, a photocurrent is produced that represents the sensor output.

However, such devices also exhibit a dark current, which represents the current that is output even in the absence of light. Dark current reduces the sensitivity of a sensor and needs to be accounted for as a component of the sensor output. For conventional light sensors, where the sensor is illuminated from the front, a hole accumulation layer may be formed at the sensing surface to suppress dark current. This is not an option for backside illumination sensors because metallization layers are generally formed under the sensing surface.

SUMMARY

A light sensor includes a photodiode and a hole accumulation layer directly on a sensing surface of the photodiode. A metal oxide layer is formed over the hole accumulation layer. An anti-reflection layer is formed over the metal oxide layer.

A method of forming a light sensor includes forming a hole accumulation layer on a sensing surface of a photodiode. A metal oxide layer is deposited over the hole accumulation layer. An anti-reflection layer is deposited over the metal oxide layer.

A method of forming a light sensor includes epitaxially growing a hole accumulation layer on a sensing surface of a photodiode. The hole accumulation layer has a germanium concentration of at least 80%. An aluminum metal oxide layer is deposited over the hole accumulation layer using atomic layer deposition. An anti-reflection layer is deposited over the metal oxide layer. An opaque light shield layer is formed on the anti-reflection layer having a gap over the photodiode. An encapsulating layer is formed over the anti-reflection layer and the light shield layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide backside illumination light sensors with low dark current by growing a hole accumulation layer on the sensing surface of a photodiode. The structure of the present embodiments can achieve a low interface state density without a high-temperature anneal, which eliminates paths for dark currents. A hole accumulation layer collects holes on the surface of the photodiode, suppressing the dark component that arises from the interface state.

Figure 1:
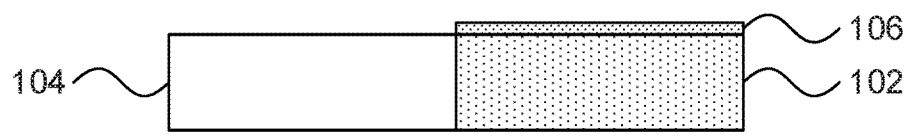
FIG. 1 is a cross-sectional diagram of a step in the fabrication of a back illuminated light sensor having low dark current in accordance with an embodiment of the present invention.

Referring now to FIG. 1, a cross-sectional view of a step in the formation of a low dark current backside illumination light sensor is shown. A photodiode 102 is shown adjacent to peripheral circuitry 104. It should be understood that additional circuitry may be present underneath the photodiode 102 and the peripheral circuitry 104, including for example metallization layers and other circuitry.

The photodiode 102 may be, for example, a p-n or p-i-n junction photodiode, where respective regions of a semiconductor material are doped with appropriately typed dopants. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

The semiconductor material of the photodiode 102 may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof.

A hole accumulation layer 106 is selectively grown on the surface of the photodiode 102. It is specifically contemplated that the hole accumulation layer 106 may be grown by an epitaxial growth process. The terms "epitaxial growth and/or deposition" as used herein refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

It is specifically contemplated that the hole accumulation layer 106 may be formed from, e.g., silicon germanium having a germanium concentration of greater than about 80%. While there is nothing to physically preclude the use of germanium concentrations of less than 80%, concentrations above 80% provide a dramatic reduction in interface states density. The hole accumulation layer 106 may alternatively be formed from pure germanium. Because the crystal structure of the hole accumulation layer 106 may differ slightly from that of the photodiode 102, the thickness of the hole accumulation layer 106 is kept below a thickness that causes defects to form. For example, a hole accumulation layer 106 that is formed from silicon germanium and that is grown from a doped silicon photodiode surface may have a thickness of less than about 10 nm to prevent defect formation.

Selective growth on only the photodiode 102 may be achieved using a patterned mask layer, such as silicon nitride, that covers the peripheral circuit 104 during the epitaxial growth process. In one example, a pattern is produced by applying a photoresist to the surface of the mask layer. The photoresist is exposed to a pattern of radiation. The pattern is then developed into the photoresist using a resist developer. Once the patterning of the photoresist is completed, the sections covered by the photoresist are protected while the exposed regions are removed using a selective etching process that removes the unprotected regions. The epitaxial growth can then proceed without affecting the peripheral circuit 104.

Figure 2:
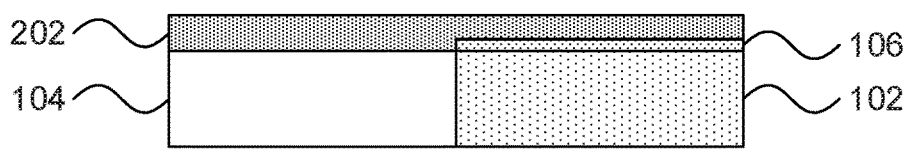
FIG. 2 is a cross-sectional diagram of a step in the fabrication of a back illuminated light sensor having low dark current in accordance with an embodiment of the present invention.

Referring now to FIG. 2, a cross-sectional view of a step in the formation of a low dark current backside illumination light sensor is shown. A metal oxide layer 202 is formed over the photodiode 102 and the peripheral circuit 104. It is specifically contemplated that the metal oxide layer 202 may be formed from an aluminum oxide using, for example, an atomic layer deposition (ALD) process using water and trimethylaluminum. During ALD, chemical precursors react with the surface of a material one at a time to deposit a thin film on the surface. ALD is used to avoid damage to the sensing surface, which would lead to an increase in the interface states density. The metal oxide layer 202 may have a thickness between about 1 Å and about 30 Å, though other thicknesses may also be used.

Figure 3:
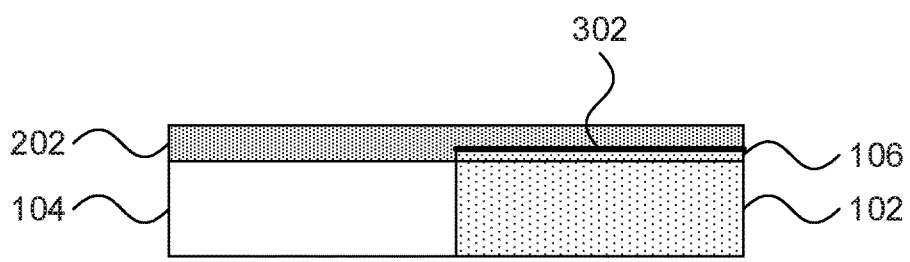
FIG. 3 is a cross-sectional diagram of an optional step in the fabrication of a back illuminated light sensor having low dark current in accordance with an embodiment of the present invention.

Referring now to FIG. 3, a cross-sectional view of an optional step in the formation of a low dark current backside illumination light sensor is shown. In this optional step, a germanium dioxide layer 302 may be formed after deposition of the metal oxide layer 202 using a post-deposition oxidation process such as, e.g., an ozone anneal or a plasma treatment with an oxygen-containing species. The post-deposition oxidation process forces oxygen through the metal oxide layer to react with the surface of the underlying hole accumulation layer 106.

Figure 4:
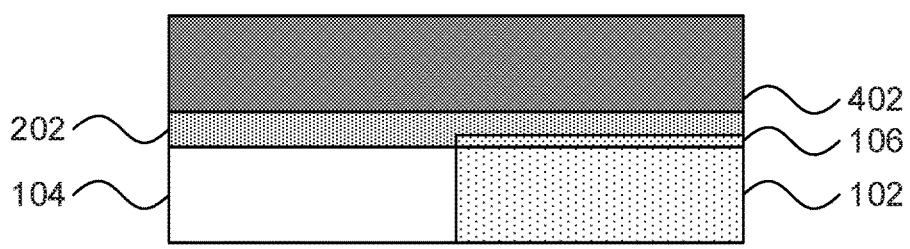
FIG. 4 is a cross-sectional diagram of a step in the fabrication of a back illuminated light sensor having low dark current in accordance with an embodiment of the present invention.

Referring now to FIG. 4, a cross-sectional view of a step in the formation of a low dark current backside illumination light sensor is shown. An anti-reflection layer 402 is formed on the metal oxide layer 202 by, e.g., an ALD or physical vapor deposition (PVD) process. It is specifically contemplated that the anti-reflection layer 402 may be formed from hafnium dioxide and may have a thickness between about 100 Å and about 600 Å, though other materials and other thicknesses may also be used. In alternative embodiments that use PVD, a sputtering apparatus may include direct-current diode systems, radio frequency sputtering, magnetron sputtering, or ionized metal plasma sputtering.

Figure 5:
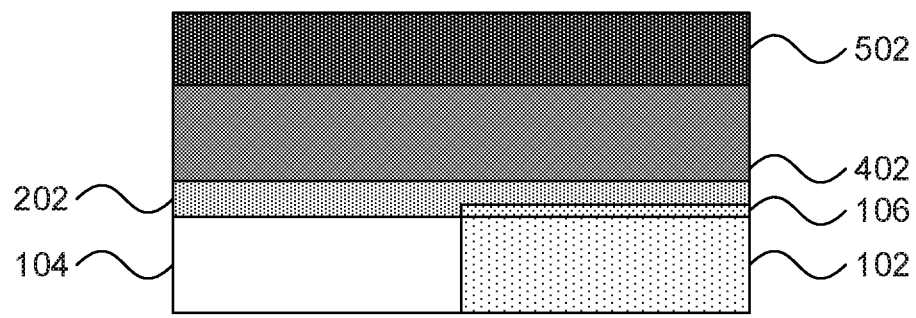
FIG. 5 is a cross-sectional diagram of a step in the fabrication of a back illuminated light sensor having low dark current in accordance with an embodiment of the present invention.

Referring now to FIG. 5, a cross-sectional view of a step in the formation of a low dark current backside illumination light sensor is shown. A layer of opaque material 502 is deposited over the anti-reflection layer 402. The opaque material may include any appropriate material that will protect the peripheral circuit 104 from incident light and may be deposited by any appropriate deposition process such as, e.g., ALD, PVD, or chemical vapor deposition (CVD). CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed.

Figure 6:
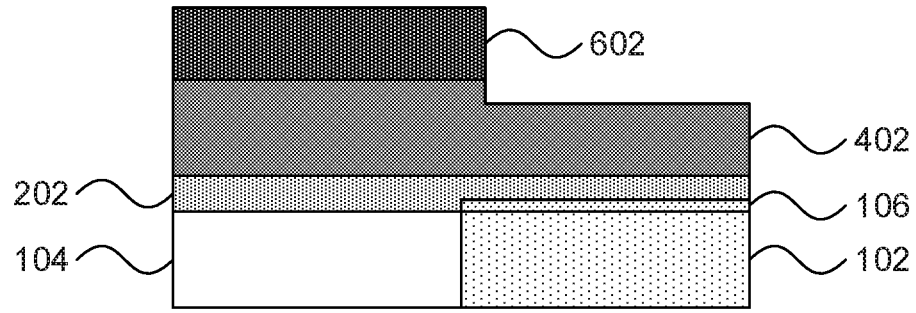
FIG. 6 is a cross-sectional diagram of a step in the fabrication of a back illuminated light sensor having low dark current in accordance with an embodiment of the present invention.

Referring now to FIG. 6, a cross-sectional view of a step in the formation of a low dark current backside illumination light sensor is shown. The layer of opaque material 502 is patterned and etched back to form light shield layer 602 that protects the peripheral circuit 104 from incoming light while allowing light to reach the photodiode 102. The anti-reflection layer 402 may also be partially etched back during this process. It is specifically contemplated that the etch may be an anisotropic etch such as a reactive ion etch (RIE).

RIE is a form of plasma etching in which, during etching, the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 7:
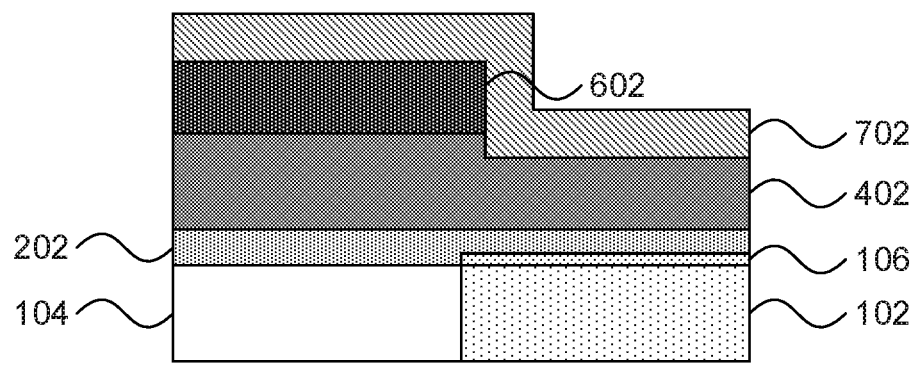
FIG. 7 is a cross-sectional diagram of a step in the fabrication of a back illuminated light sensor having low dark current in accordance with an embodiment of the present invention.

Referring now to FIG. 7, a cross-sectional view of a step in the formation of a low dark current backside illumination light sensor is shown. An encapsulating layer 702 is conformally formed over the exposed surfaces. The encapsulating layer 702 may be made of any appropriate material at any appropriate thickness to both protect the underlying layers and circuitry while still being thin enough to allow light to reach the photodiode 102.

Figure 8:
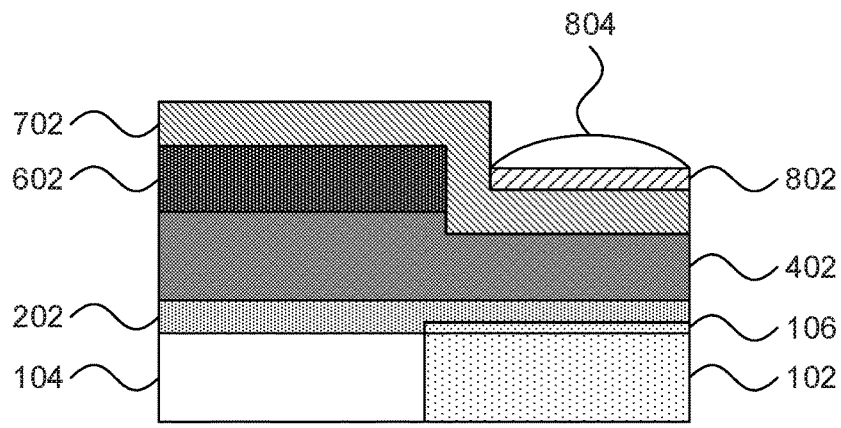
FIG. 8 is a cross-sectional diagram of a step in the fabrication of a back illuminated light sensor having low dark current in accordance with an embodiment of the present invention.

Referring now to FIG. 8, a cross-sectional view of a step in the formation of a low dark current backside illumination light sensor is shown. One or more color filters 802 and respective lenses 804 are placed to help incoming light of a desired wavelength or wavelengths to converge at the photodiode 102. The color filter(s) 802 may be, for example, a Bragg filter that transmits light of a particular wavelength and reflects all other wavelengths, though it should be understood that other filtering devices may be used instead.

The present embodiments provide substantial reductions in dark current. In particular, interface states densities of between about than about $2\times10^{11}$ and about $3\times10^{11}$ cm$^2$ eV$^{-1}$ can be achieved without a high temperature anneal, eliminating paths for dark currents. In contrast, conventional devices that do not have the hole accumulation layer 106 show interface states densities on the order of $10^2$ cm$^2$ eV$^{-1}$. In addition, the hole accumulation layer 106 has a large valence band offset relative that of silicon, which further aids in hole accumulation at the sensing surface.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 9:
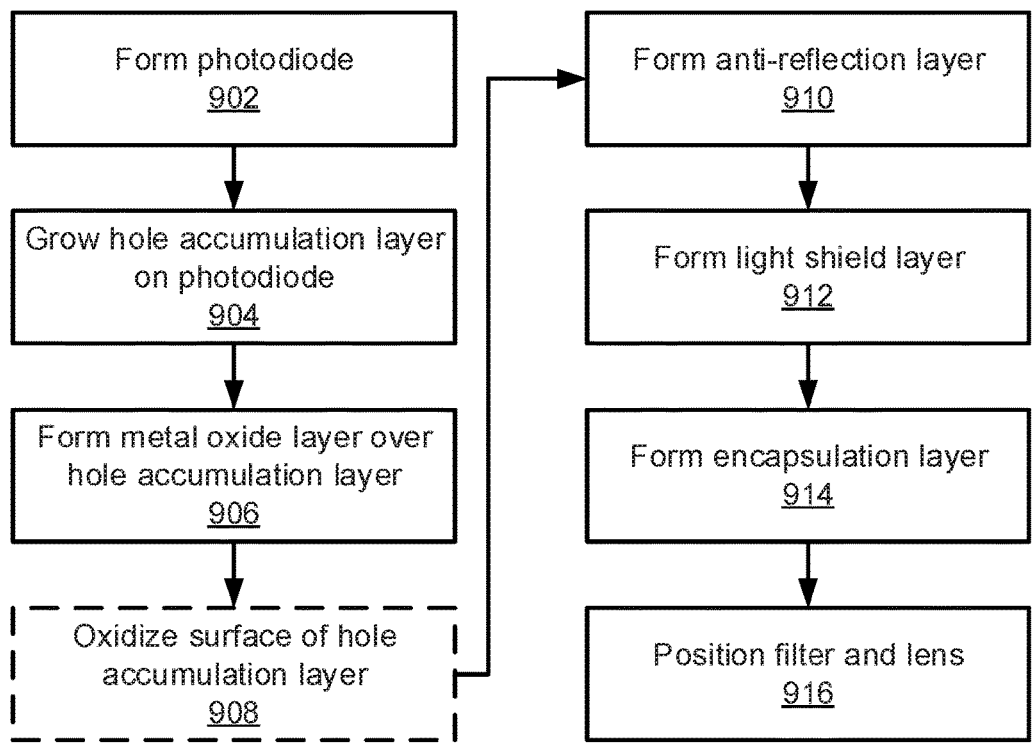
FIG. 9 is a block/flow diagram of a method of forming a back illuminated light sensor having low dark current in accordance with an embodiment of the present invention.

Referring now to FIG. 9, a method of forming a low dark current, back illuminated light sensor is shown. Block 902 forms the photodiode 102 by e.g., forming a p-n or p-i-n junction. The photodiode 102 can be formed by ion implantation of appropriate p-type and n-type dopants or by in situ doping during epitaxial growth. Block 904 then grows hole accumulation layer 106 on the surface of the photodiode 102. As noted above, it is specifically contemplated that the hole accumulation layer 106 may be formed by epitaxial growth from pure germanium or by silicon germanium having a germanium concentration over about 80%.

Block 906 forms a metal oxide layer 202 over the hole accumulation layer 106. It is specifically contemplated that the metal oxide layer 202 may be formed from, e.g., $Al_2O_3$ using ALD. As noted above, ALD is specifically contemplated because other deposition processes may damage the hole accumulation layer 106 and cause a rise in dark current. Block 908 optionally oxidizes the surface of the hole accumulation layer 106 to form, e.g., a germanium dioxide layer 302. This may be performed by driving oxygen through the metal oxide layer 202 using, for example, an ozone anneal or a plasma treatment using oxygen-containing species.

Block 910 forms an anti-reflection layer 402 over the metal oxide layer 202. It is specifically contemplated that the anti-reflection layer 402 may be formed from hafnium dioxide using, e.g., ALD or PVD, though it should be understood that any appropriate anti-reflection material may be used instead. Block 912 forms a light shield layer 602 to protect any peripheral circuits 104 while still allowing light to reach the photodiode 102.

Block 914 then forms an encapsulation layer 702 over the light shield layer 602 and the exposed portion of the anti-reflection layer 402. The encapsulation layer 702 may be formed from, e.g., silicon nitride or any other appropriate dielectric material by any appropriate conformal deposition process. Block 916 then positions a color filter 802 and lens 804 over the photodiode 102.

Having described preferred embodiments of a low dark current backside illumination sensor (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:
1. A light sensor, comprising:
a photodiode;
a hole accumulation layer epitaxially grown from a sensing surface of the photodiode;
a metal oxide layer over the hole accumulation layer; and
an anti-reflection layer over the metal oxide layer.

2. The light sensor of claim 1, wherein the hole accumulation layer comprises germanium at a concentration of at least 80%.

3. The light sensor of claim 2, wherein the hole accumulation layer comprises pure germanium.

4. The light sensor of claim 2, further comprising a germanium dioxide layer formed directly on a top surface of the hole accumulation layer.

5. The light sensor of claim 1, wherein the metal oxide layer comprises aluminum oxide.

6. The light sensor of claim 1, further comprising an opaque light shield layer having a gap over the photodiode.

7. The light sensor of claim 6, further comprising an encapsulating layer over the anti-reflection layer and the light shield layer.

8. A method of forming a light sensor, comprising:
epitaxially growing a hole accumulation layer from a sensing surface of a photodiode;
depositing a metal oxide layer over the hole accumulation layer; and
depositing an anti-reflection layer over the metal oxide layer.

9. The method of claim 8, wherein the hole accumulation layer comprises germanium at a concentration of at least 80%.

10. The method of claim 9, wherein the hole accumulation layer comprises pure germanium.

11. The method of claim 9, further comprising forming a germanium dioxide layer directly on a top surface of the hole accumulation layer.

12. The method of claim 11, wherein forming the germanium dioxide layer comprises a process selected from the group consisting of an ozone anneal and a plasma treatment with an oxygen-containing species.

13. The method of claim 8, wherein the metal oxide layer comprises aluminum oxide.

14. The method of claim 8, further comprising forming an opaque light shield layer having a gap over the photodiode.

15. The method of claim 14, further comprising an encapsulating layer over the anti-reflection layer and the light shield layer.

16. The method of claim 8, wherein depositing the metal oxide layer comprises an atomic layer deposition process.

17. A method of forming a light sensor, comprising:
epitaxially growing a hole accumulation layer on a sensing surface of a photodiode that comprises germanium at a concentration of at least 80%;
depositing an aluminum metal oxide layer over the hole accumulation layer using atomic layer deposition;
depositing an anti-reflection layer over the metal oxide layer;
forming an opaque light shield layer on the anti-reflection layer having a gap over the photodiode; and
depositing an encapsulating layer over the anti-reflection layer and the light shield layer.

18. The method of claim 17, further comprising forming a germanium dioxide layer directly on a top surface of the hole accumulation layer by a process selected from the group consisting of an ozone anneal and a plasma treatment with an oxygen-containing species.

* * * * *